United States Patent [19]

Brettle et al.

[11] Patent Number: 4,614,963

[45] Date of Patent: Sep. 30, 1986

[54] PLASTICS ENCAPSULATED ELECTRONIC DEVICES

[75] Inventors: Jack Brettle, Towcester; Martin T. Goosey, Kingsley, both of England

[73] Assignee: Plessey Overseas Limited, Illford, England

[21] Appl. No.: 552,867

[22] Filed: Nov. 18, 1983

Related U.S. Application Data

[63] Continuation of Ser. No. 318,360, Nov. 5, 1981, abandoned.

[30] Foreign Application Priority Data

Nov. 8, 1980 [GB] United Kingdom ................. 8035975
Jun. 17, 1981 [GB] United Kingdom ................. 8118685

[51] Int. Cl.[4] .............................................. H01L 23/30
[52] U.S. Cl. .................................. 357/72; 174/52 PE; 264/272.11; 264/272.17; 428/76; 106/14.44
[58] Field of Search ...................... 357/72; 174/52 PE; 264/272.11, 272.17; 106/14.44; 524/406; 428/68, 76, 413, 418

[56] References Cited

U.S. PATENT DOCUMENTS 3,939,488  2/1976  Wakashima et al. ................. 357/72
4,327,369  4/1982  Kaplan ................................... 357/72

*Primary Examiner*—Alexander S. Thomas
*Attorney, Agent, or Firm*—Fleit, Jacobson, Cohn & Price

[57] ABSTRACT

The plastic encapsulation material covering an integrated circuit is impregnated with a corrosion inhibitor evenly dispensed throughout the material. This inhibits the corrosion of the metallization on the surface of the integrated circuit thus prolonging the life of the device particularly under adverse environmental conditions.

2 Claims, No Drawings

PLASTICS ENCAPSULATED ELECTRONIC DEVICES

This application is a continuation of application Ser. No. 318,360, filed Nov. 5, 1981, now abandoned.

The present invention relates to plastic encapsulated electronic devices and more particularly to the inhibition of corrosion in such devices during their lifetime. Of all the solid state devices produced, a large proportion are now encapsulated in plastic and very often this is the only form in which they are available. This situation has arisen because the largest demand for devices comes from the consumer electronics industry which requires its components at the lowest possible cost. Unfortunately, under certain conditions plastic encapsulated devices are not as reliable as their more expensive hermetically sealed counterparts, posing a problem for the defence industry which requires devices that are capable of giving the utmost reliability under very harsh operating conditions for many years.

One of the major failure mechanisms in plastic encapsulated devices is that of the corrosion of the aluminium metallisation on the microcircuit surface which is caused by a combination of several factors. All plastic encapsulants are permeable to moisture in the atmosphere and thus water can appear at the chip surface. The encapsulants used are mostly highly filled transfer moulding resins and these contain ionic impurities as additives and by-products from their manufacture. Any moisture diffusing through the resin will pick up these ions and form an aggressive electrolyte. In the presence of the high field gradients that are found between conductors on the chip surface corrosion reactions occur which can rapidly cause the device to fail.

The removal or reduction of this failure mechanism would allow a more widespread use of plastic encapsulated devices, particularly in military electronics.

Current methods of protecting the microcircuit surface involve the use of passivating layers between the resin and the chip to prevent the ingress of corrosive electrolytes. However, these layers often have pin holes in them and they cannot cover the bond pads, so it is still possible for corrosion to occur. In addition there are situations, e.g. double layer metallisation circuits using polyimide cross-over dielectric, where conventional silicon nitride or phosphosilicate glass passivation cannot be used and less protective polyimide has to be employed. Our invention augments the use of passivating layers and gives an extra degree of protection not currently obtainable. The incorporation of the corrosion inhibitors into the encapsulating resins is a relatively simple operation and the whole encapsulating process can be carried out with no modifications to the previously used methods. The only other ways of achieving similar corrosion protection would be by using ultra pure resins with reduced permeability to water; the production of which would be extremely difficult. Even if such resins were available it is unlikely that there would be no corrosion and they would still benefit from the addition of inhibitors.

It is therefore an object of the present invention to reduce the corrosion of the metal layer on the surface of an encapsulated electronic device.

The present invention therefore provides a plastic encapsulated electronic device in which a corrossion inhibitor is present in the plastic material to reduce corrosion of the metallisation during the lifetime of the device.

In a first preferred embodiment the corrosion inhibitor encapsulated within the plastics resin is p-Cresol. In a second preferred embodiment the corrosion inhibitor is Calcium Citrate and in a third preferred embodiment this corrosion inhibitor is Ammonium Tungstate.

Preferably the optimum concentration for ammonium tungstate is between 500 and 1000 ppm and for p-Cresol it is in the region of 1800 ppm. Calcium citrate has been found to work well at a concentration of 5000 ppm.

The metallisation of primary importance is aluminium but aluminium alloys and other metals e.g. gold, silver and copper will benefit from the inclusion of a corrosion inhibitor.

The invention concerns the incorporation of corrosion inhibitors into encapsulating resins to reduce one of the main failure mechanisms of plastic encapsulated electronic devices. A group of most likely corrosion inhibitors was selected and incorporated into an encapsulating resin; specially designed microcircuits produced and encapsulated with these modified resins. These were then examined under temperature, humidity, bias accelerated lifetest conditions. The times to failure have been compared with those of devices encapsulated with uninhibited resin and those that gave improved lifetimes were selected for further examination. This involved varying the concentrations of the inhibitor in the resin to determine the optimum concentration ranges. The resins containing inhibitors were examined using microbalance and thermomechanical techniques to check that their incorporation did not adversely affect the curing reaction or its water permeability. Also adhesion tests were performed to ensure that adhesion of the resin to substrate was not adversely affected.

MOS devices were encapsulated with resins containing corrosion inhibitors to determine whether the increased concentrations of ionic species at the resin/chip interface cause any malfunctioning of the devices. An improvement in reliability has been shown for devices encapsulated with resins containing ammonium tungstate, p-cresol and calcium citrate.

Aluminium generally possesses a very good resistance to corrosion due to the rapid formation of a passivating oxide layer on its surface. This oxide layer is stable over a pH range from 3 to 9 but at pH's smaller and greater than these the oxide is thermodynamically unstable. At low pH rapid dissolution occurs with the formation of $Al^{3+}$ ions whilst at high pH dissolution occurs by the formation of the aluminate ion $AlO_2-$. Corrosion of aluminium in this manner is a common problem when aluminium is used as a structural material.

Exactly the same type of corrosion can occur at the microcircuit surface and once galvanic corrosion is initiated in a polarised circuit fixed anodic and cathodic sites are established.

It has been found that the electrochemical reactions occuring at these sites cause pH changes to occur producing an acidic anolyte and a basic catholyte. These concentration balances can persist in localised areas because of the restricted diffusion at the microcircuit surface/encapsulant interface, allowing localised accelerated corrosion to continue at these sites.

In selecting corrosion inhibitors that might be useful for preventing microcircuit corrosion by incorporation into the encapsulating resin several important factors have to be taken into account. The inorganic inhibitors are mostly anions and there is often a choice of complimentary cation. Many metallic ions are known to have a deleterious effect on the performance of electronic devices due to their capability of diffusing into silicon dioxide and silicon. This precludes the use of small ions such as sodium.

Generally group 1 elements were found not to be suitable although the heavier elements of the group may be suitable.

Transition elements particularly those of group 8, such as iron, osmium and ruthenium were also found to be unsuitable.

The cations that are most suitable are Ca, Sr, Ba, Mo, Cs, W, Al, Pb and Sn.

Any material chosen must have a minimum solubility in water to allow it to be transported from the bulk of the resin to the microcircuit surface by diffusing moisture to compensate any depletion at the surface. Diffusion rates for these inhibitors when transported by water through these resins is low, however the diffusion rates for the deleterious impurities are also low therefore a sufficient concentration of inhibitor can be maintained at the microcircuit surface for our purposes. It must be thermally stable at transfer molding temperatures (typically 10 hours at 170°) and not interfere with the curing reaction of the resin. Based upon these above criteria the following inhibitors were selected for investigation.

(1) p Toluidine
(2) p Cresol
(3) Furfuraldehyde
(4) Dicyandiamide
(5) Calcium Citrate
(6) Ammonium Tungstate
(7) Barium chromate
(8) Sodium silicate
(9) Barium Permanganate.

Of these inhibitors the greatest improvements in lifetimes have been shown for devices encapsulated with resins containing p Cresol, Calcium citrate and Ammonium Tungstate. The effects of inhibitor concentration have been investigated and for ammonium tungstate the optimum concentration is between 500 and 1000 ppm whilst for p Cresol it is around 1800 ppm.

In a preferred practical embodiment the inhibitor was sieved with epoxy powdered resin followed by Ball milling for 30 minutes to give a fine dispersion of the inhibitor in the resin which on subsequent fusing of the powder gives a product of uniform composition. This form of incorporation can be employed when the resin in its final compounded state is available from the manufacturer. Alternatively the inhibitor can be added by the resin manufacturer during blending when other additives e.g. mould release agents etc. are added.

The curing was at low temperature and subsequent testing at 85° C. showed good corrosion inhibition.

In addition to the inhibition of corrosion of aluminium and aluminium alloys other metals incorporated in integrated circuits may be protected by the incorporation of suitable inhibitors in the protective resin.

In particular "electronic" materials such as gold, silver and copper suffer from an electrochemical failure mechanism where they are anodically dissolved, transported and cathodically plated elsewhere. This causes effective migration of the metal and growth of short circuiting filaments. This degradation can be prevented by inhibiting the initial anodic dissolution stage with one or more appropriate inhibitors for the metals. This failure mechanism is also related particularly to printed circuit boards to counteract the problem of water diffusion through the conformal resin coatings used to protect the boards.

The incorporation of these inhibitors does not have any deleterious effects on the curing reaction of the resin. Glass transition temperatures, water solubility and diffusion coefficients have been determined for resins containing inhibitors and no deleterious effects noted. Although the use of inhibitors in resins has been discussed largely with respect to epoxy powder transfer moulding compounds for microcircuit protection its use is wider than this e.g. with liquid transfer moulding compounds and thermoplastic moulding compounds. Also there are applications in other protective schemes such as conformal coatings on hybrid circuits, the use of silicone gel in chip carrier packages and "potting" resins for a variety of active and passive electronic devices.

What we claim is:

1. A plastic encapsulated electronic device in which p-Cresol is present in the plastic material to reduce corrosion of the metallisation during the lifetime of the electronic device.

2. A plastic encapsulated electronic device as claimed in claim 1 in which the p-Cresol is present in the plastic at a concentration of approximately 1800 parts per million.

* * * * *